United States Patent
Guo et al.

(10) Patent No.: US 10,741,390 B2
(45) Date of Patent: Aug. 11, 2020

(54) FORMING METHOD OF EPITAXIAL LAYER, FORMING METHOD OF 3D NAND MEMORY AND ANNEALING APPARATUS

(71) Applicant: Yangtze Memory Technologies Co., Ltd., Wuhan, Hubei Province (CN)

(72) Inventors: Haifeng Guo, Wuhan (CN); Xiaojin Wang, Wuhan (CN); Hongbin Zhu, Wuhan (CN); Lin Lai, Wuhan (CN); Teng Cheng, Wuhan (CN); Lihong Xiao, Wuhan (CN)

(73) Assignee: Yangtz Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/351,532

(22) Filed: Mar. 13, 2019

(65) Prior Publication Data
US 2020/0161131 A1  May 21, 2020

Related U.S. Application Data

(63) Continuation of application No. PCT/CN2018/116491, filed on Nov. 20, 2018.

(51) Int. Cl.
*H01L 21/02* (2006.01)
*H01L 21/3065* (2006.01)
(Continued)

(52) U.S. Cl.
CPC .. *H01L 21/02694* (2013.01); *H01L 21/02532* (2013.01); *H01L 21/02639* (2013.01);
(Continued)

(58) Field of Classification Search
CPC ......... H01L 21/02694; H01L 29/40117; H01L 21/02639; H01L 21/324; H01L 21/31116;
(Continued)

(56) References Cited

U.S. PATENT DOCUMENTS

| | | | |
|---|---|---|---|
| 2013/0178044 A1 | 7/2013 | Kang | |
| 2016/0005760 A1* | 1/2016 | Lee | H01L 27/1157 257/324 |

(Continued)

FOREIGN PATENT DOCUMENTS

| | | |
|---|---|---|
| CN | 104882374 B | 3/2018 |
| CN | 108807409 A | 11/2018 |

(Continued)

*Primary Examiner* — Mohammed R Alam
(74) *Attorney, Agent, or Firm* — Winston Hsu (57) ABSTRACT

A forming method of an epitaxial layer, a forming method of a 3D NAND memory and an annealing apparatus are provided. In the forming method of the epitaxial layer, a first annealing process is performed for eliminating a stress generated in a stacked structure. When performing the first annealing process, a silicon-containing mixture is formed on a sidewall and a bottom surface of a trench. Thus, after performing the first annealing process, a second annealing process is performed for removing the silicon-containing mixture disposed at the sidewall and the bottom surface of the trench, such that when subsequently forming the epitaxial layer, a growth interface of the epitaxial layer is a pure substrate material interface, so as to prevent from be formed a void defect in the epitaxial layer formed in the trench.

16 Claims, 6 Drawing Sheets

(51) Int. Cl.
*H01L 21/67* (2006.01)
*H01L 21/324* (2006.01)
*H01L 27/11582* (2017.01)
*H01L 21/311* (2006.01)
*H01L 21/28* (2006.01)

(52) U.S. Cl.
CPC .... *H01L 21/3065* (2013.01); *H01L 21/31116* (2013.01); *H01L 21/324* (2013.01); *H01L 21/67109* (2013.01); *H01L 27/11582* (2013.01); *H01L 29/40117* (2019.08)

(58) Field of Classification Search
CPC ......... H01L 21/02532; H01L 27/11582; H01L 21/3065; H01L 21/67109
See application file for complete search history.

(56) References Cited

U.S. PATENT DOCUMENTS

| | | |
|---|---|---|
| 2017/0077100 A1 | 3/2017 | Takahashi |
| 2017/0140936 A1* | 5/2017 | Chu .................... H01L 29/0657 |
| 2017/0345907 A1 | 11/2017 | Seol |
| 2018/0204835 A1 | 7/2018 | Or-Bach |
| 2018/0315770 A1 | 11/2018 | Choi |

FOREIGN PATENT DOCUMENTS

| | | |
|---|---|---|
| CN | 108807410 A | 11/2018 |
| JP | 2017-55082 A | 3/2017 |
| TW | 201810425 A | 3/2018 |
| TW | I630709 B | 7/2018 |

* cited by examiner

FORMING METHOD OF EPITAXIAL LAYER, FORMING METHOD OF 3D NAND MEMORY AND ANNEALING APPARATUS

CROSS REFERENCE TO RELATED APPLICATIONS

This patent application is a continuation of International Application PCT/CN2018/116491, filed Nov. 20, 2018, the contents of which are hereby incorporated by reference in their entirety.

BACKGROUND OF THE INVENTION

1. Field of the Invention

The present invention relates to a field of forming semiconductor, and more particularly to a forming method of an epitaxial layer, a forming method of a 3D NAND memory and an annealing apparatus.

2. Description of the Prior Art

An NAND flash memory is a storage device better than a hard disk drive. With the pursuit of the non-volatile storage device with low-power, low-mass and high-performance, the NAND flash memory has been widely used in the electronic product. Currently, the planar NAND flash memory has had the practical expansion approaching an upper limit. In order to further increase the storage capacity and reduce the storage cost per bit, a 3D NAND memory with a 3D structure is proposed.

In the structure of the 3D NAND memory, a stacked structure of the 3D NAND memory is realized by using a method of vertically stacking a plurality of data storage units. The existed forming method of the 3D NAND memory generally includes: forming a stacked layer structure having silicon nitride layers and silicon oxide layers stacked alternately on the substrate; etching the stacked layer structure to form channel holes in the stacked layer structure, and etching the substrate situated at bottoms of the channel holes after forming the channel holes, so as to form trenches in the substrate; utilizing a selective epitaxial growth process to form an epitaxial silicon structure in the trenches at the bottom of the channel hole, and the epitaxial silicon structure is usually referred as SEG; forming a storage region in the channel hole; and removing the silicon nitride layers and forming a plurality of metal gates at positions corresponding to the removed silicon nitride layers.

When using the existed process to form the epitaxial silicon structure (SEG), a void defect is easily generated in the bottom region of the epitaxial silicon structure (SEG), such that the electrically contacting performance between the epitaxial silicon structure (SEG) and the substrate is worse, which affects the property of the 3D NAND memory.

SUMMARY OF THE INVENTION

A technical problem to be solved by the present invention is to prevent the void defect from being formed in the formed epitaxial layer (SEG), so as to increase the electrically contacting performance between the epitaxial silicon structure (SEG) and the substrate.

In order to solve the aforementioned problems, the present invention provides a forming method of an epitaxial layer including:

providing a substrate, wherein a stacked structure having a plurality of first insulating layers and a plurality of second insulating layers stacked alternately is formed on the substrate; etching the stacked structure to form a plurality of channel holes passing through the stacked structure; etching the substrate situated at bottoms of the channel holes along the channel holes to form a plurality of trenches in the substrate; performing a first annealing process after forming the trenches, wherein a silicon-containing mixture is formed on sidewalls and bottom surfaces of the trenches when performing the first annealing process; performing a second annealing process after performing the first annealing process, so as to remove the silicon-containing mixture; and utilizing a selective epitaxial growth process to form an epitaxial layer in the trenches after performing the second annealing process, wherein the trenches are fully filled with the epitaxial layer.

Optionally, in addition to including the silicon in the silicon-containing mixture, the silicon-containing mixture further includes one or more of elements contained in a gas used for the first annealing process, elements contained in a source gas and/or a by-product when forming the first insulating layer, and elements contained in a source gas and/or a by-product when forming the second insulating layer.

Optionally, a gas atmosphere of the first annealing process is nitrogen ($N_2$), and a gas atmosphere of the second annealing process is hydrogen ($H_2$).

Optionally, a material of the first insulating layer and a material of the second insulating layer are individually one of silicon oxide, silicon nitride, silicon oxynitride and silicon carbide nitride, and the material of the first insulating layer is different from the material of the second insulating layer.

Optionally, in addition to including the silicon in the silicon-containing mixture, the silicon-containing mixture further includes one or more of N, C, H and O.

Optionally, during the second annealing process, a temperature is 800-1200° C., a process time is 1-10 hours and a pressure of a chamber is less than 100 torr.

Optionally, a gas utilized in the second annealing process is reacted with the silicon-containing mixture to form a gaseous reactant when preforming the second annealing process.

Optionally, Miller indices of the sidewall of the trench are expressed as (111) after performing the second annealing process.

The present invention further provides a forming method of a 3D NAND memory including:

providing a substrate, wherein a stacked structure having a plurality of first insulating layers and a plurality of second insulating layers stacked alternately is formed on the substrate; etching the stacked structure to form a plurality of channel holes passing through the stacked structure; etching the substrate situated at bottoms of the channel holes along the channel holes to form a plurality of trenches in the substrate; performing a first annealing process after forming the trenches, wherein a silicon-containing mixture is formed on sidewalls and bottom surfaces of the trenches when performing the first annealing process; performing a second annealing process after performing the first annealing process, so as to remove the silicon-containing mixture; utilizing a selective epitaxial growth process to form an epitaxial layer in the trenches after performing the second annealing process, wherein the trenches are fully filled with the epitaxial layer; forming a storage structure in the channel holes above the epitaxial layer; and removing the first insulating layers, and forming a plurality of metal gates at positions corresponding to the removed first insulating layers.

Optionally, in addition to including the silicon in the silicon-containing mixture, the silicon-containing mixture further includes one or more of elements contained in a gas used for the first annealing process, elements contained in a source gas and/or a by-product when forming the first insulating layer, and elements contained in a source gas and/or a by-product when forming the second insulating layer.

Optionally, a gas atmosphere of the first annealing process is $N_2$, a gas atmosphere of the second annealing process is $H_2$.

Optionally, a material of the first insulating layer and a material of the second insulating layer are individually one of silicon oxide, silicon nitride, silicon oxynitride and silicon carbide nitride, and the material of the first insulating layer is different from the material of the second insulating layer.

Optionally, in addition to including the silicon in the silicon-containing mixture, the silicon-containing mixture further includes one or more of N, C and H.

Optionally, during the second annealing process, a temperature is 800-1200° C., a process time is 1-10 hours and a pressure of a chamber is less than 100 torr.

Optionally, a gas utilized in the second annealing process is reacted with the silicon-containing mixture to form a gaseous reactant when preforming the second annealing process.

Optionally, Miller indices of the sidewall of the trench are expressed as (111) after performing the second annealing process.

The present invention further provides an annealing apparatus configured to perform the second annealing process to the aforementioned substrate, and the annealing apparatus includes:

a reactive chamber;

a wafer cassette placed in the reactive chamber, wherein the wafer cassette has a cassette body recessed inward, an inner sidewall of the cassette body has a plurality of supporting structures for placing wafers, and a thickness of a corner of the cassette body of the wafer cassette and a thickness of the supporting structures are greater than a thickness of any other portion of the cassette body;

a gas-supplying end configured to supply the reactive chamber with a processing gas; and a heater configured to heat the wafers on the wafer cassette in the reactive chamber.

Optionally, the thicknesses of the corner and the supporting structures of the cassette body are greater than the thickness of any other portion of the cassette body by 0.5-5 cm.

Optionally, the thicknesses of the corner and the supporting structures of the cassette body are 1.1-10 cm.

Optionally, when the heater heats, a temperature in the reactive chamber is 800-1200° C., and a heating time is 1-10 hours. Optionally, the supplied processing gas includes $H_2$.

Optionally, the annealing apparatus is capable of further performing the first annealing process Optionally, the supplied processing gas includes $N_2$ when performing the first annealing process.

Compared with the prior art, the present invention has the below advantages:

In the forming method of the epitaxial layer of the present invention, the first annealing process is performed after forming the channel holes and the trenches, so as to eliminate the stress generated in the stacked structure. When performing the first annealing process, the silicon-containing mixture is formed on the sidewall and the bottom surface of the trench. Thus, after performing the first annealing process, the second annealing process is performed for removing the silicon-containing mixture disposed on the sidewall and the bottom surface of the trench, such that when subsequently forming the epitaxial layer, the growth interface of the epitaxial layer is a pure substrate material interface, so as to prevent the void defect from being formed in the epitaxial layer formed in the trench.

Furthermore, the material of the first insulating layer and the material of the second insulating layer are individually one of silicon oxide, silicon nitride, silicon oxynitride and silicon carbide nitride. When forming the first insulating layers and the second insulating layers, a portion of elements (such as C, H, N, O) of the source gas (the gas used in the chemical vapor deposition process) and a portion of elements (such as C, H, N) of the by-product may be trapped or remained in the formed silicon nitride layers and the formed silicon oxide layers. When performing the first annealing process, the trapped or remained elements may be released under the high temperature condition, and may diffuse to the bottom surface and the sidewall surface of the trench, and these elements are reacted with the monocrystalline substrate material of the bottom surface of the trench and the monocrystalline substrate material of the sidewall surface of the trench to form the complex silicon-containing mixture. Thus, in addition to including the silicon in the silicon-containing mixture, the silicon-containing mixture further includes one or more of N, C, H and O. The silicon-containing mixture can be removed by the second annealing process including $H_2$.

Furthermore, when using $H_2$ to performing the second annealing process, the temperature is 800-1200° C., the process time is 1-10 hours, and the pressure of the chamber is less than 100 torr. This embodiment uses the annealing process with high temperature and long process time, such that the silicon-containing mixture can be removed cleaner and more effectively.

The forming method of the 3D NAND memory of the present invention performs the second annealing process to remove the silicon-containing mixture disposed on the sidewall and the bottom surface of the trench, such that when forming the epitaxial layer, the growth interface of the epitaxial layer is a pure substrate material interface, so as to prevent the void defect from being formed in the epitaxial layer formed in the trench. Thus, the electrical conductivity between the epitaxial layer and the substrate is not affected, which enhances the property of the 3D NAND memory.

In the annealing apparatus of the present invention, the thickness of the corner of the cassette body of the wafer cassette and the thickness of the supporting structures are greater than the thickness of any other portion of the cassette body, such that the wafer cassette may withstand the annealing process with high temperature (greater than 800° C.) and long process time (greater than 1 hour), and a crack or a fragmentation may be prevent from being generated at the fragile corner (such as the junction between the sidewall and the bottom of the cassette body of the wafer cassette) and the fragile supporting structure of the cassette body of the wafer cassette. That is, the annealing apparatus of the present invention can realize an annealing process with high temperature and long process time, and the treatment of annealing a batch of wafers may be realized. Therefore, when the second annealing process applied on the wafer (the substrate) of the aforementioned scheme is performed in the annealing apparatus of the present invention, while improving efficiency, the effectiveness of removing the silicon-containing mixture on the sidewall and the bottom surface of the trench is better.

DETAILED DESCRIPTION

As stated in the background, the void defect is easily generated in the bottom region of the epitaxial silicon structure (SEG) formed by the existing process, such that the electrically contacting performance between the epitaxial silicon structure (SEG) and the substrate is inferior, which affects the property of the 3D NAND memory.

The research found that the reason for the easy generation of the void defect in the bottom region of the existing epitaxial silicon structure (SEG) is that: a complex silicon-containing mixture is formed on a sidewall and a bottom surface of a trench situated at a bottom of the channel hole during the forming process of the 3D NAND memory, wherein the silicon-containing mixture prevents the sidewall and the bottom of the trench from maintaining a state of pure monocrystalline silicon, and when a selective epitaxial growth process is used to form the epitaxial silicon structure (SEG) in the trench, since a growth rate of silicon on the surface of the silicon-containing mixture is different from a growth rate of silicon on the surface of the monocrystalline silicon, the void defect is easily generated in the epitaxial silicon structure (SEG). In the following, the specific process for generating the aforementioned reasons and the specific process of forming the void defect will be described in detail taken in conjunction with FIGS. 1-4.

Figure 1:
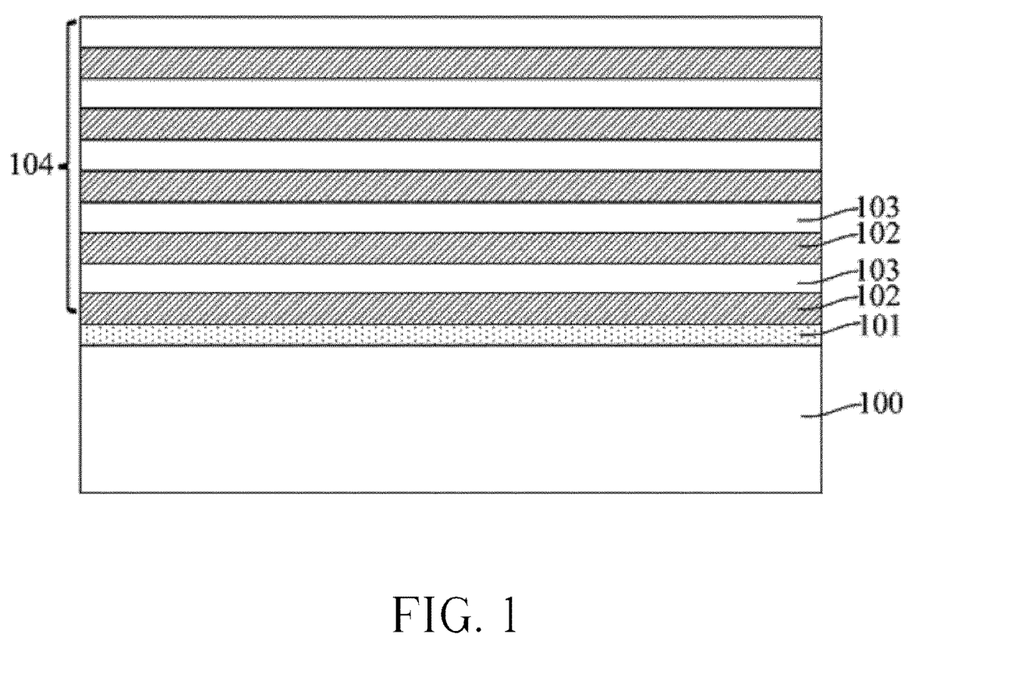
FIGS. 1-4 are schematic diagrams showing structures during a forming process of an epitaxial layer according to an embodiment of the present invention.

Referring to FIG. 1, a stacked layer structure 104 having silicon nitride layers 102 and silicon oxide layers 103 stacked alternately is formed on a substrate 100, and an isolating layer 101 may be further formed between the stacked structure 104 and the substrate 100.

Figure 2:
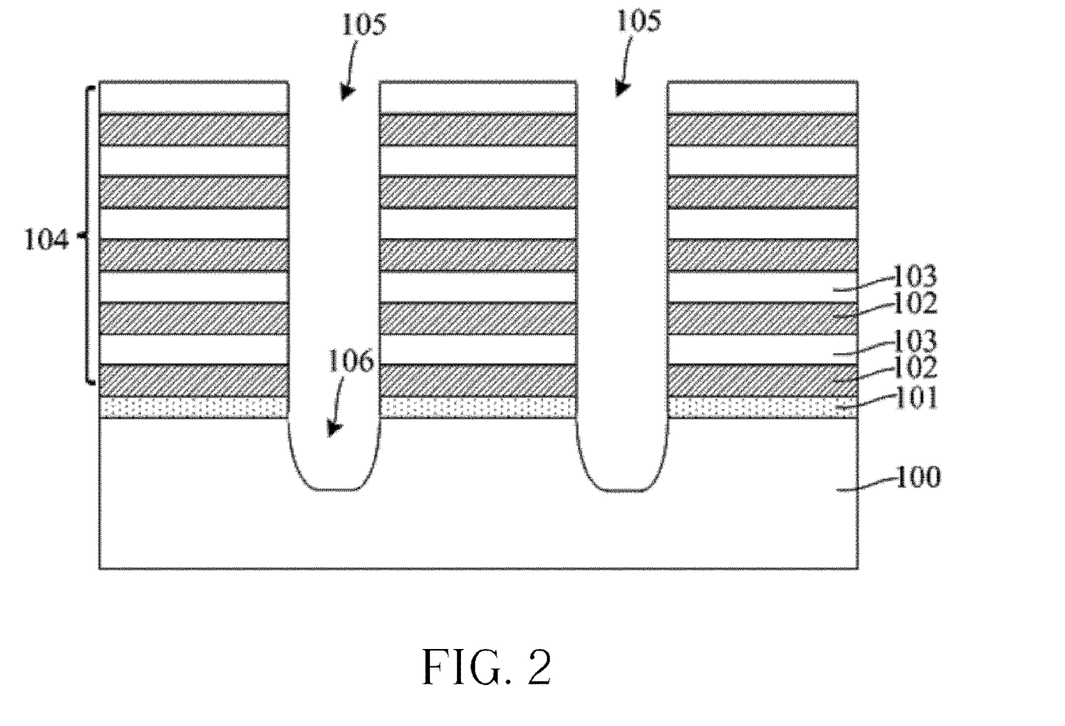

Referring to FIG. 2, the stacked layer structure 104 is etched to form channel holes 105 in the stacked layer structure 104, and after forming the channel holes 105, the substrate 100 situated at bottoms of the channel holes 105 is etched so as to form trenches 106 in the substrate 100.

Figure 3:
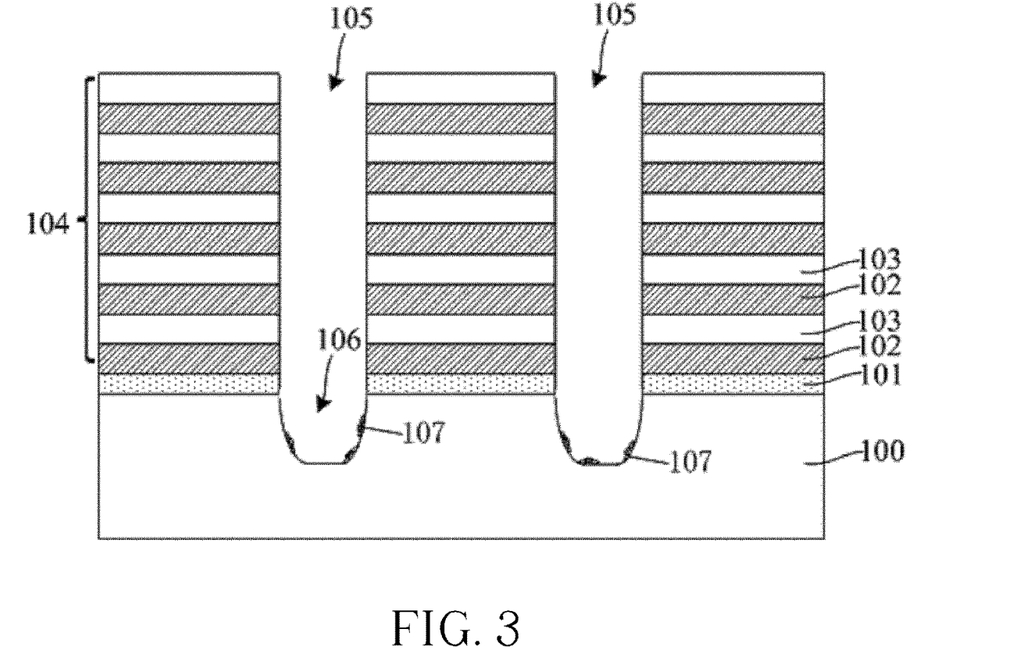
Figure 4:
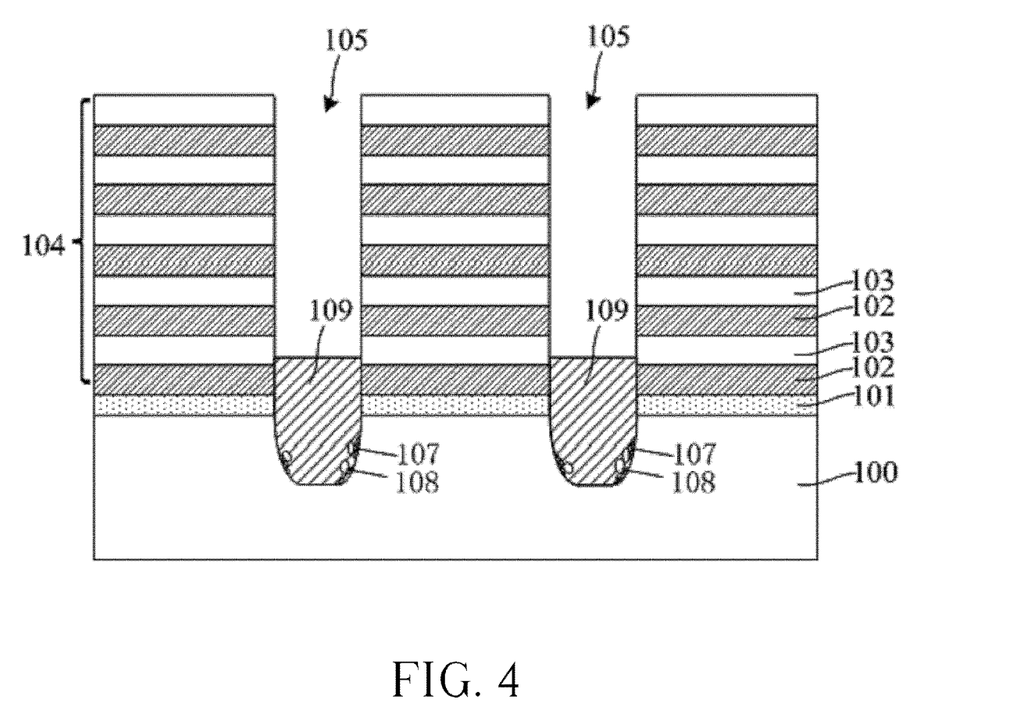

Referring to FIG. 3 and FIG. 4 together, after forming the trenches 106, an annealing process is performed to the stacked structure 104 in a nitrogen ($N_2$) atmosphere, so as to release the stress existing in the stacked structure 104. In a further research, since the silicon nitride layers 102 and the silicon oxide layers 103 are formed by the chemical vapor deposition process(es), a portion of elements (such as C, H, N, O) of a source gas (a gas used in the chemical vapor deposition process) and a portion of elements (such as C, H) of by-product(s) may be trapped or remained in the silicon nitride layers 102 and the silicon oxide layers 103 or in the stacked structure 104 when forming the silicon nitride layers 102 and the silicon oxide layers 103, especially when the silicon nitride layers 102 and the silicon oxide layers 103 are stacked as a multiple-layer structure. During the annealing process, these elements may be released from the silicon nitride layers 102 and the silicon oxide layers 103 or from the stacked structure 104, and may diffuse to a bottom surface and a sidewall surface of the trench 106, and then, these elements may react with the monocrystalline substrate material (Si) of the bottom surface and sidewall surface of the trench 106 to form a complex silicon-containing mixture 107. The existence of the silicon-containing mixture 107 makes the interface, which is configured to grow the epitaxial silicon structure by a selective epitaxial growth process, be not a pure monocrystalline silicon interface. Thus, when growing the silicon by the selective epitaxial growth process, a growth rate of silicon on the surface of the complex silicon-containing mixture 107 is different from a growth rate of silicon on the surface of the monocrystalline silicon, such that the epitaxial silicon structure 109 formed in the trench (referring to FIG. 4) has the void defect 108 (referring to FIG. 4). Also, the void defect 108 mainly exists at a contact interface between the epitaxial silicon structure 109 and the substrate 100 and at a contact interface between the epitaxial silicon structure 109 and the silicon-containing mixture 107, and/or if the trench is deep, the void defect 108 may exist in the epitaxial silicon structure 109.

In some embodiments, although a cleaning process may be performed before forming the epitaxial silicon structure 109 in the trench 106, the silicon-containing mixture cannot be removed cleanly regardless of using a wet cleaning or a dry cleaning. Furthermore, the wet cleaning and the dry cleaning may introduce new impurities, such that the interface configured to grow the epitaxial silicon structure 109 by a selective epitaxial growth process is not a pure monocrystalline silicon interface. Therefore, the void defect still exists in the formed epitaxial silicon structure 109.

Accordingly, another embodiment of the present invention provides a forming method of an epitaxial layer, a forming method of a 3D NAND memory and an annealing apparatus. In the forming method of the epitaxial layer, a first annealing process is performed after forming channel holes and trenches, so as to eliminate the stress generated in a stacked structure. When performing the first annealing process, a silicon-containing mixture is formed on a sidewall and a bottom surface of the trench. Thus, after performing the first annealing process, a second annealing process is performed for removing the silicon-containing mixture disposed on the sidewall and the bottom surface of the trench, such that when subsequently forming the epitaxial layer, a growth interface of the epitaxial layer is a pure substrate material interface, so as to prevent a void defect from being formed in the epitaxial layer formed in the trench.

In order to make the above objects, features and advantages of the embodiments of the present invention be more clearly understood, the specific embodiments of the present invention will be described in detail taken in conjunction with the accompanying drawings in the below. In the description of the specific embodiments, for the convenience of description, the drawings are only examples and will not be partially enlarged with the general proportion, and the drawings are not intended to limit the protection scope of the present invention. Moreover, the actual production should include the three-dimensional dimensions of length, width and depth.

Figure 5:
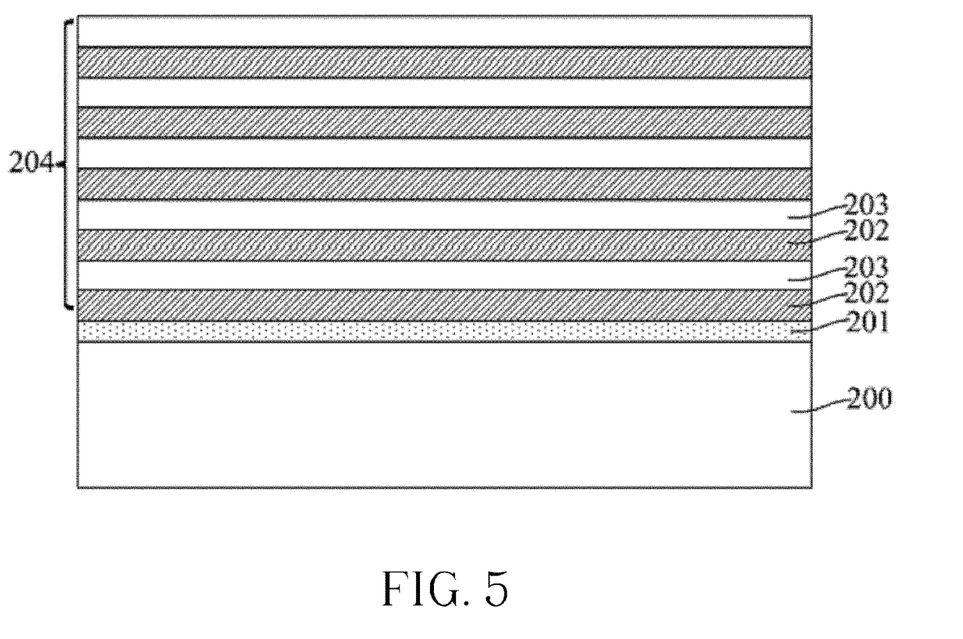
FIGS. 5-9 are schematic diagrams showing structures during a forming process of an epitaxial layer according to another embodiment of the present invention.

FIGS. 5-11 are schematic diagrams showing structures during the forming process of the epitaxial layer according to another embodiment of the present invention Referring to FIG. 5, a substrate 200 is provided. A stacked structure 204 having a plurality of first insulating layers 202 and a plurality of second insulating layers 203 stacked alternately is formed on the substrate 200.

A material of the substrate 200 may be monocrystalline silicon (Si), monocrystalline germanium (Ge), silicon germanium (GeSi) or silicon carbide (SiC); the material of the substrate 200 may be silicon on insulator (SOI) or germanium on insulator (GOI) also; or the material of the substrate 200 may be any other material, such as III-V compound (e.g. gallium arsenide, etc.). In this embodiment, the material of the substrate 200 is monocrystalline silicon (Si).

In this embodiment, the first insulating layers 202 are served as sacrificial layers. In a subsequent process, the first insulating layers 202 are removed and metal gates will be formed at positions corresponding to the removed first insulating layers 202.

A material of the first insulating layer 202 is different from a material of the second insulating layer 203. In an embodiment, the material of the first insulating layer 202 and the material of the second insulating layer 203 are individually one of silicon oxide, silicon nitride, silicon oxynitride and silicon carbide nitride. In this embodiment, the material of the first insulating layer 202 is silicon nitride, the material of the second insulating layer 203 is silicon oxide, and the forming process of the first insulating layers 202 and the second insulating layers 203 is a chemical vapor deposition process.

The chemical vapor deposition process configured to form the layers generally includes: inputting a source gas into the chamber, wherein the source gas is reacted to form the layers on the substrate. The specific description of the formation of the silicon oxide layer (the second insulating layer 203) is in the following. In an embodiment, the chemical vapor deposition process configured to form the silicon oxide layer (the second insulating layer 203) includes: inputting the source gas into the reactive chamber, wherein the source gas includes a silicon source gas and an oxygen source gas, the silicon source gas is silane or TEOS, the oxygen source gas is $O_2$, CO or $ON_2$, the flow rates of the silicon source gas and the oxygen source gas are 100-8000 ml./min (milliliter standard per minute), the temperature is 300-800° C., and the pressure is 3-200 torr.

When using the chemical vapor deposition process to form the first insulating layers 202 and the second insulating layers 203 (particularly, for forming the stacked structure 204 having multi-layer), a portion of elements (such as C, H, N, O) of the source gas (a gas used in the chemical vapor deposition process) and a portion of elements (such as C, H, N) of the by-product may be trapped or remained in the first insulating layers 202 and the second insulating layers 203. Specifically, in this embodiment, one or more of C and H may be trapped or remained in the first insulating layer 202 when forming the first insulating layer 202 including the silicon nitride material, and one or more of C, H, N and O may be trapped or remained in the second insulating layer 203 when forming the second insulating layer 203 including the silicon oxide material.

Note that, in the formation for alternately stacking the first insulating layers 202 and the second insulating layers 203, after forming one first insulating layer 202, one second insulating layer 203 is correspondingly formed on a surface of the first insulating layer 202, and the step of forming the first insulating layer 202 and the step of forming the second insulating layer 203 are subsequently performed in sequence.

The layer numbers of the first insulating layers 202 and the second insulating layers 203 (or the layer number of the stacked structure 204) are determined according to a requiring number of storage units in a vertical direction. The layer numbers of the first insulating layers 202 and the second insulating layers 203 (or the layer number of the stacked structure 204) may be 8, 32, 64, etc. The integration level is greater as the layer number of the stacked layer structure is more. In this embodiment, for example, the layer numbers of the first insulating layers 202 and the second insulating layers 203 (or the layer number of the stacked structure 204) are 5.

In an embodiment, a bottom insulating layer 201 may be further formed between the stacked structure 204 and the substrate 200. A material of the bottom insulating layer 201 is silicon oxide, and the bottom insulating layer 201 is formed by a thermal oxidation process. The bottom insulating layer 201 may reduce the stress effect of the stacked structure 204 on the substrate 200.

Figure 6:
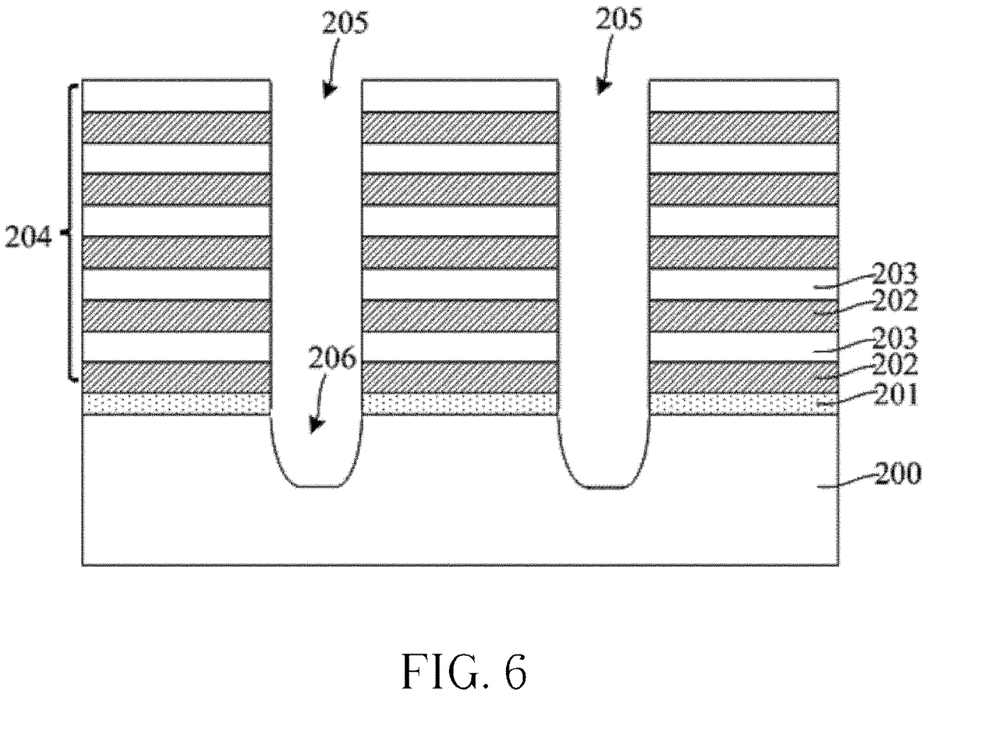

Referring to FIG. 6, the stacked structure 204 is etched to form a plurality of channel holes 205 passing through the stacked structure 204; the substrate 200 situated at bottoms of the channel holes 205 is etched along the channel holes 205, so as to form a plurality of trenches 206 in the substrate 200.

In a subsequent process, a storage structure is formed in the channel hole 205, an epitaxial layer is formed in the trench 206.

In an embodiment, before etching the stacked structure 204, a patterned mask layer is formed on a surface of the stacked structure. When etching the stacked structure, the patterned mask layer is configured to be a mask.

The stacked structure 204 is etched by an anisotropic dry etching process. For instance, the anisotropic dry etching process may be a plasma etching process or a reactive ion etching process, and a gas used in the etching process includes a gas containing carbon and fluorine.

In an embodiment, the step of etching the substrate 200 to form the trenches 206 may be performed by an over-etching process after the step of etching the stacked structure 204 to form the channel holes 205. In other embodiments, the step of etching the substrate 200 to form the trenches 206 may be performed by using an additional etching process after the step of etching the stacked structure 204 to form the channel holes 205. The step of etching the stacked structure 204 to form the channel holes 205 and the step of etching the substrate 200 to form the trenches 206 may be completed in the same etching chamber or may be completed in different etching chambers.

In this embodiment, the sidewall of the formed trench 206 is arc-shaped, and the width of the trench 206 is less as the distance from the surface of the substrate 200 is farther. Note that, in other embodiments, the sidewall of the trench 206 may be any other shape.

Figure 7:
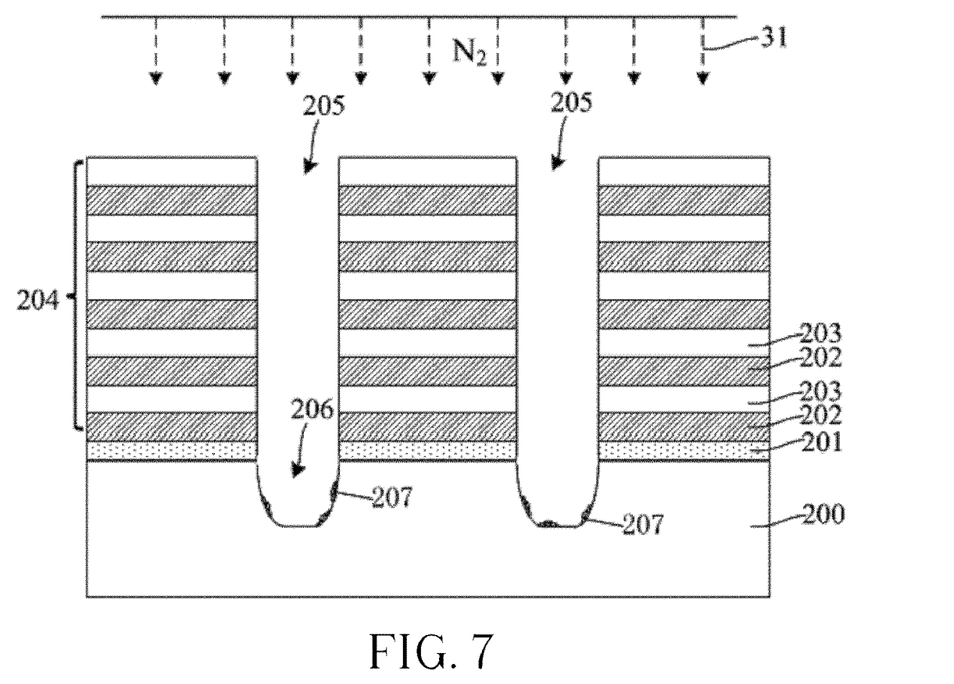

Referring to FIG. 7, after forming the trenches 206, the first annealing process 31 is performed. When performing the first annealing process 31, a silicon-containing mixture 207 is formed on the sidewall and the bottom surface of the trench 206.

An purpose of performing the first annealing process 31 is to remove the stress in the stacked structure 204 and the stress between the stacked structure 204 and the substrate 200, so as to prevent the stacked structure from collapse due to the stress effect.

A gas atmosphere of the first annealing process 31 is an inert gas atmosphere, so as to prevent the substrate 200 from being oxidized. The gas atmosphere of the first annealing process of this embodiment is $N_2$, and $N_2$ is cheap and cannot cause the substrate to be oxidized. In other embodiments, the inert gas atmosphere, such as Ar gas, may be used.

In the find of the research, when performing the first annealing process 31, the elements trapped or remained in the first insulating layers 202 and the second insulating layers 203 or in the stacked structure 204 may be released under the high temperature condition, and may diffuse to the bottom surface and the sidewall surface of the trench 206, and then, these elements are reacted with the monocrystalline substrate material of the bottom surface of the trench 206 and the monocrystalline substrate material of the sidewall surface of the trench 206 to form the complex silicon-containing mixture 207. Therefore, in addition to including the silicon in the silicon-containing mixture, the silicon-containing mixture further includes one or more of the elements contained in the source gas and/or the by-product when forming the first insulating layer, and the elements contained in the source gas and/or the by-product when forming the second insulating layer.

In this embodiment, in addition to including the silicon in the silicon-containing mixture 207, the silicon-containing mixture 207 further includes one or more of N, C, H and O.

The existence of the silicon-containing mixture 207 makes the interface configured to subsequently grow the epitaxial layer (the sidewall and the bottom surface of the trench 206) be not a pure substrate material interface (e.g. a monocrystalline silicon interface or a monocrystalline germanium interface, etc.). If the epitaxial layer is directly formed in the trench 206, the void defect is easily formed in the epitaxial layer.

Figure 8:
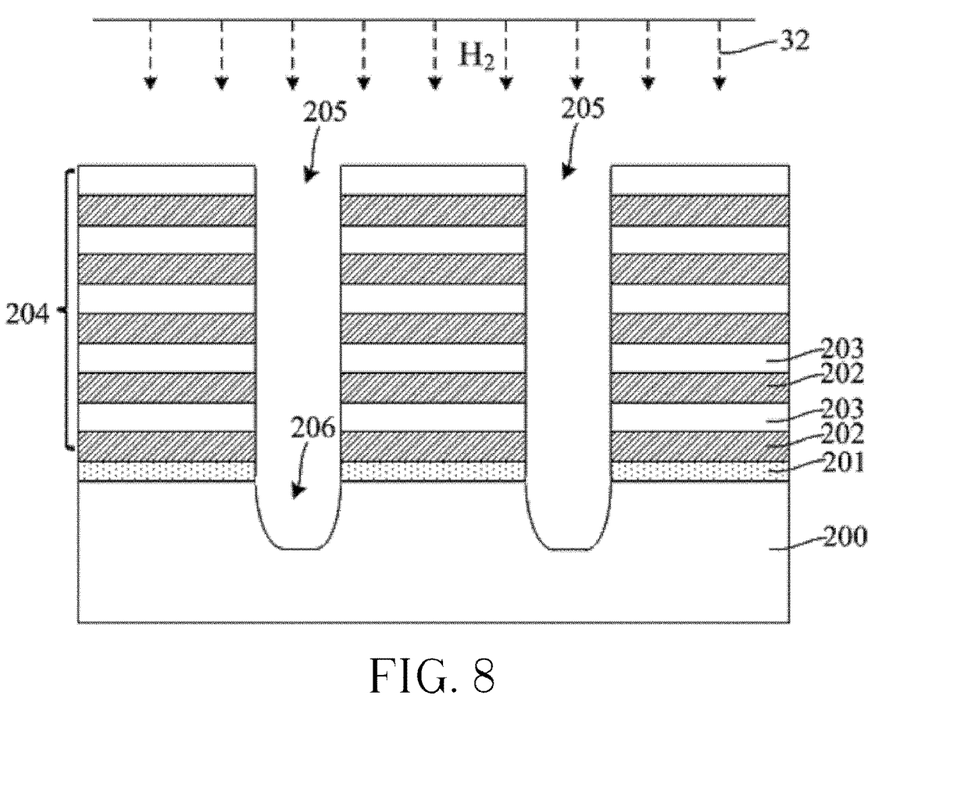

Referring to FIG. 7 and FIG. 8, the second annealing process 32 is performed after performing the first annealing process 31, so as to remove the silicon-containing mixture 207 situated on the sidewall and the bottom surface of the trench 206.

The second annealing process 32 is performed in an annealing chamber of an annealing apparatus. When performing the second annealing process 32, a gas used in the second annealing process 32 is reacted with the silicon-containing mixture 207 to form a gaseous reactant. The gaseous reactant is directly discharged outside the annealing chamber, thereby removing the silicon-containing mixture 207 situated on the sidewall and the bottom surface of the trench 206. Thus, when subsequently forming the epitaxial layer the epitaxial layer, a growth interface of the epitaxial layer is a pure substrate material interface.

In this embodiment, a gas atmosphere of the second annealing process is $H_2$. The use of $H_2$ not only removes the silicon-containing mixture 207 but also does not damage the substrate 200 exposed by the trench 206. The principle of removing the silicon-containing mixture 207 by using $H_2$ can be referred to the below formula:

When performing the second annealing process, $H_2$ is reacted with Si of the silicon-containing mixture 207 to form a Si—H bond, and the Si—H bond continues to be reacted with the remaining mixture to form the gaseous reactant.

In this embodiment, when using $H_2$ to perform the second annealing process 32, the temperature is 800-1200° C., the process time is 1-10 hours, and the pressure of the chamber is less than 100 torr. The second annealing process 32 used in this embodiment is an annealing process with high temperature and long process time, such that the silicon-containing mixture 207 can be removed cleaner and more effectively.

In an embodiment, after performing the second annealing process 32 under the condition of aforementioned parameters, Miller indices of the surrounding sidewall of the trench 206 are expressed as (111). When subsequently using the selective epitaxial growth process to form the epitaxial layer in the trench 206, the formed epitaxial layer and the substrate 200 may constitute an integrated structure, the contact interface between the epitaxial layer and the substrate does not exist, and the void defect does not exist in the epitaxial layer. Note that, the Miller indices (indices of crystal face) are a kind of the constants of the crystal, and are a reciprocal ratio of intercept coefficients of a crystal plane on three crystal axes, and when the reciprocal ratio is converted to be expressed by an integer ratio, three gained integers are referred as the Miller indices of this crystal plane.

In an embodiment of the present invention, after performing the first annealing process 31, the second annealing process 32 is performed directly, and any additional dry cleaning and/or wet cleaning is not performed between the first annealing process 31 and the second annealing process 32.

The first annealing process 31 and the second annealing process 32 may be performed in the same annealing apparatus, or may be performed in different annealing apparatuses.

Figure 9:
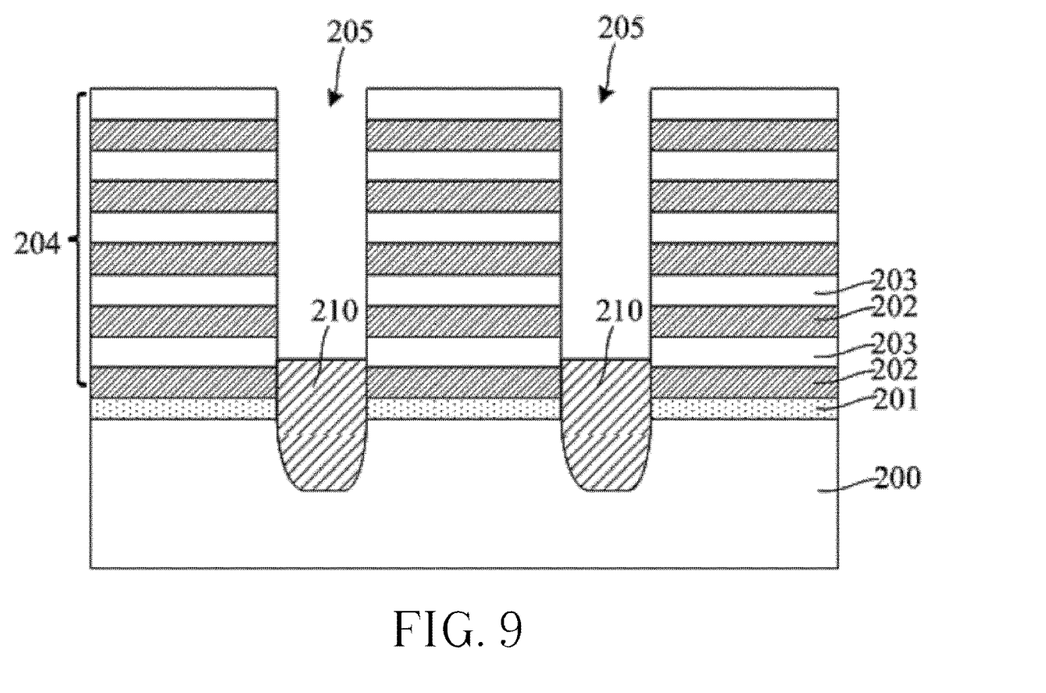
Figure 10:
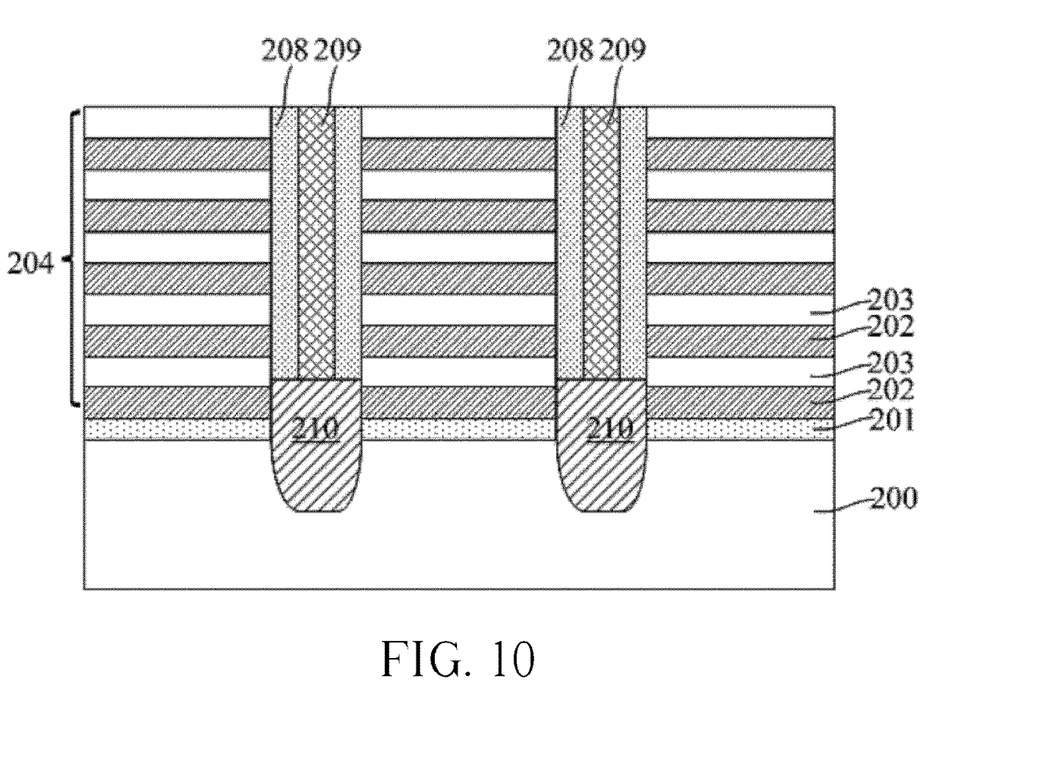
FIGS. 10-11 are schematic diagrams showing 3D NAND structures according to another embodiment of the present invention.

Referring to FIG. 9 and FIG. 10, after performing the second annealing process 32, the selective epitaxial growth process is utilized for forming the epitaxial layer 210 in the trench 206, and the trench 206 is fully filled with the epitaxial layer 210.

In this embodiment, a material of the epitaxial layer 210 is the same as the material of the substrate 200, the material of the epitaxial layer is silicon, and a surface of the epitaxial layer 210 is higher than the surface of the substrate 200. When forming the epitaxial layer 210, because the sidewall or the bottom surface of the trench 206 is the pure monocrystalline silicon interface, the growth rates of silicon on the interface or at a distance from the interface may remain the same or the have little differences, so as to prevent the void defect from be formed in the epitaxial layer 210.

In an embodiment, during the forming method of the epitaxial layer 210 including the silicon material, a reactive gas includes the silicon source gas, HCl and $H_2$, wherein the silicon source gas is one or more of $SiH_4$, $SiH_2Cl_2$, $SiHCl_3$ and $SiH_3Cl$, the flow rate of the silicon source gas is 10-900 sccm, the flow rate of HCl is 8-950 sccm, the flow rate of $H_2$ is 150-5000 sccm, the temperature of the reactive chamber is 600-850° C., the pressure of the reactive chamber is 1-100 torr.

In other embodiments, the epitaxial layer 210 may use a semiconductor material different from the material of the substrate. For instance, if the material of the substrate 200 is the monocrystalline silicon, the material of the epitaxial layer 210 may be silicon or silicon germanium. The height of the epitaxial layer may be adjusted based on an actual requirement.

Figure 11:
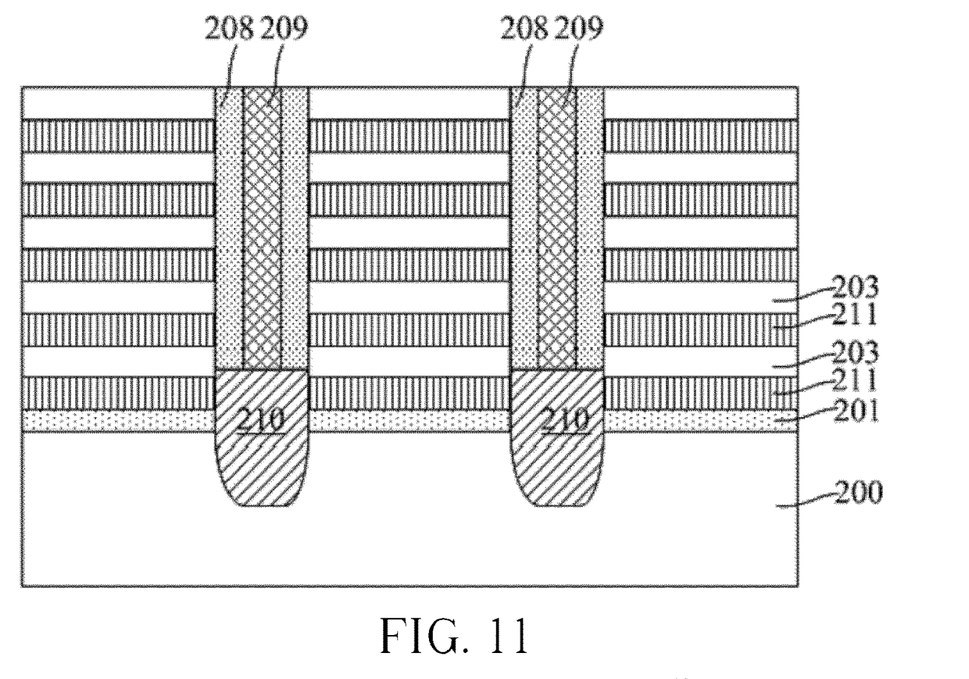

Another embodiment of the present invention further provides a forming method of a 3D NAND memory, and the detail is referred to FIGS. 10-11. Note that the descriptions or definitions of the structures of this embodiment the same as or similar to the aforementioned embodiments will not be redundantly described, and the details can be referred to the corresponding descriptions or definitions of the aforementioned embodiments.

Referring to FIG. 10, FIG. 10 is performed on the basis of FIG. 9; that is to say, after forming the epitaxial layer 210 by the method of the aforementioned embodiment, a storage structure is formed on the epitaxial layer 210.

The storage structure at least includes a charge-capturing layer and a channel layer. In this embodiment, the charge-capturing layer is ONO layer, which is a layer-stack of silicon oxide/silicon nitride/silicon oxide, and the channel layer is a polycrystalline silicon layer. In a specific embodiment, the ONO layer, the polycrystalline silicon layer and a silicon oxide layer may be sequentially deposited in the channel holes 220, so as to form the storage structure.

Referring to FIG. 11, the first insulating layers 202 (referring to FIG. 10) are removed, and a plurality of metal gates 211 are formed at positions corresponding to the removed first insulating layers 202.

The first insulating layers 202 are removed by a wet etching process, wherein regarding an etching solution used in the wet etching process, a etching rate for the first insulating layer 202 is much greater than etching rates for the second insulating layer 203 and the epitaxial layer 210. In this embodiment, the etching solution used in the wet etching process is phosphoric acid.

In the forming method of the 3D NAND memory of this embodiment, since the void defect does not exist in the epitaxial layer 210, the electrical conductivity between the epitaxial layer 210 and the substrate 200 is not affected, which enhances the property of the 3D NAND memory.

Figure 12:
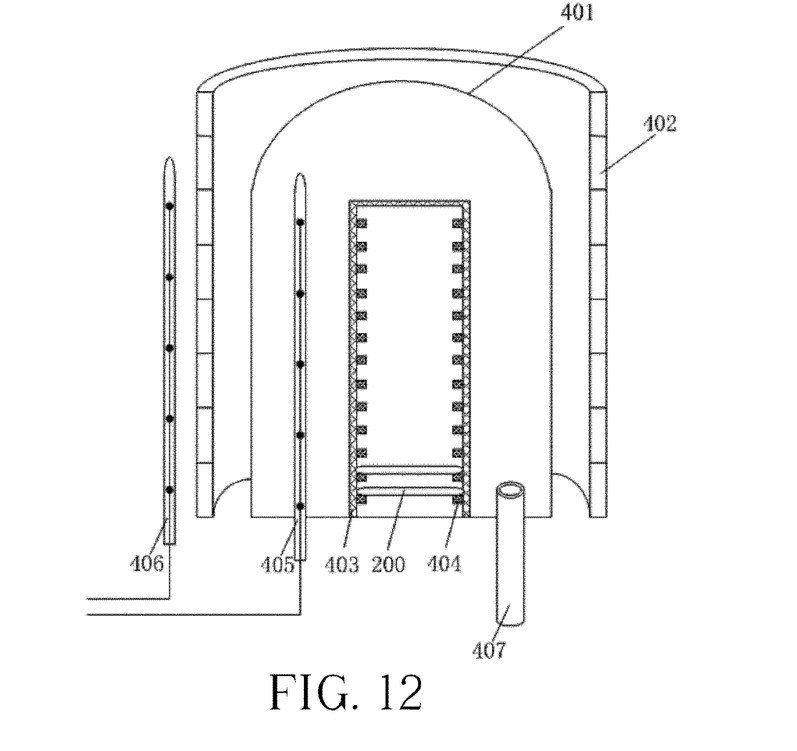
FIG. 12 is a schematic diagram showing a structure of an annealing apparatus according to another embodiment of the present invention.

Referring to FIG. 12, another embodiment of the present invention further provides an annealing apparatus configured to perform the second annealing process to the aforementioned substrate, and the annealing apparatus includes:

a reactive chamber 401;

a wafer cassette 403 placed in the reactive chamber 401, wherein the wafer cassette 403 has a cassette body recessed inward, an inner sidewall of the cassette body has a plurality of supporting structures 404 for placing wafers, and a thickness of a corner of the cassette body of the wafer cassette 403 and a thickness of the supporting structures 404 are greater than a thickness of any other portion of the cassette body;

a gas-supplying end configured to supply the reactive chamber with a processing gas; and a heater 402 configured to heat the wafers 200 on the wafer cassette 403 in the reactive chamber 401.

The wafer cassette 403 has the plurality of supporting structures 404. A material of the supporting structure 404 is the same as a material of the wafer cassette, and these material are quartz. The supporting structures can support a plurality of wafers for annealing.

In an embodiment, the wafer cassette may be a cube with an opening on one side, and the supporting structures 404 are disposed at three sides of the cube or at two opposite sides of the cube in contact with the opening.

In this embodiment, the thickness of the corner of the cassette body of the wafer cassette 403 and the thickness of the supporting structures 404 are greater than the thickness of any other portion of the cassette body, such that the wafer cassette 403 may withstand the annealing process with high temperature (greater than 800° C.) and long process time (greater than 1 hour), and a crack or a fragmentation may be prevent from being generated at the fragile corner (such as the junction between the sidewall and the bottom of the cassette body of the wafer cassette) and the fragile supporting structure of the cassette body of the wafer cassette.

In an embodiment, the thicknesses of the corner and the supporting structures of the cassette body are greater than the thickness of any other portion of the cassette body by 0.5-5 cm. In a specific embodiment, the thicknesses of the corner and the supporting structures of the cassette body are 1.1-10 cm.

When the heater 402 heats, a temperature in the reactive chamber 401 is 800-1200° C., and a heating time is 1-10 hours.

The annealing apparatus may further include an inner thermocouple 405 and an outer thermocouple 406, the inner thermocouple 405 is configured to measure the temperature of the reactive chamber 401, and the outer thermocouple 406 is configured to measure the temperature of the heater 402.

The annealing process with high temperature (greater than 800° C.) and long process time (greater than 1 hour) may be performed in the annealing apparatus of this embodiment, the crack or the fragmentation is not generated at the wafer cassette during the annealing process, and the treatment of annealing a batch of wafers may be realized. Therefore, when the second annealing process applied on the wafer (the substrate) of the aforementioned embodiment is performed in the annealing apparatus of this embodiment, while improving efficiency, the effectiveness of removing the silicon-containing mixture at the sidewall and the bottom surface of the trench is better.

When the second annealing process is performed in the aforementioned annealing apparatus, the supplied processing gas includes $H_2$.

When performing the second annealing process in the annealing apparatus of this embodiment, the wafer (the substrate) 200 needing to be annealed is placed on the supporting structure 404 of the wafer cassette 403 firstly; then, the wafer cassette is fed into the reactive chamber 401; the heater 402 heats the reactive chamber 401 to 800-1200° C., and the heating time is 1-10 hours, so as to anneal the wafer (the substrate) 200 disposed on the wafer cassette 403 in the reactive chamber 401.

In another embodiment, the first annealing process may further be performed in the aforementioned annealing apparatus, and when performing the first annealing process, the supplied processing gas includes $N_2$. Thus, in the aforementioned embodiment, through this annealing apparatus, the substrate can be directly subjected to the second annealing process after performing the first annealing process to the substrate, such that there is no need to move the wafer cassette out of the reactive chamber 401, so as to reduce the process step. Specifically, the wafer (the substrate) 200 needing to be annealed is placed on the supporting structure 404 of the wafer cassette 403 firstly; then, the wafer cassette is fed into the reactive chamber 401; the gas-supplying end supplies the reactive chamber 401 with $N_2$, and the heater 402 heats the reactive chamber 401 to the first annealing temperature, so as to perform the first annealing process; the gas-supplying end stops supplying the reactive chamber 401 with $N_2$ and supplies the reactive chamber 401 with $H_2$, and the heater 402 continues to heat for increasing temperature and heats the reactive chamber 401 to the second annealing temperature, so as to perform the second annealing process.

The above only describes the preferred embodiments of the present invention, it should be noted that those skilled in the art can make several improvements, modifications and alterations without departing from the principles of the present invention, and it should be considered that these improvements, modifications and alterations are in the scope of protection of the present invention.

What is claimed is:

1. A forming method of an epitaxial layer, comprising:
providing a substrate, wherein a stacked structure having a plurality of first insulating layers and a plurality of second insulating layers stacked alternately is formed on the substrate;

etching the stacked structure to form a plurality of channel holes passing through the stacked structure;

etching the substrate situated at bottoms of the plurality of channel holes along the plurality of channel holes to form a plurality of trenches in the substrate;

performing a first annealing process after forming the plurality of trenches, wherein a silicon-containing mixture is formed on sidewalls and bottom surfaces of the plurality of trenches when performing the first annealing process;

performing a second annealing process after performing the first annealing process, so as to remove the silicon-containing mixture; and utilizing a selective epitaxial growth process to form an epitaxial layer in the plurality of trenches after performing the second annealing process, wherein the plurality of trenches are fully filled with the epitaxial layer.

2. The forming method of the epitaxial layer of claim 1, wherein in addition to comprising the silicon in the silicon-containing mixture, the silicon-containing mixture further comprises one or more of elements contained in a gas used for the first annealing process, elements contained in a source gas and/or a by-product when forming the plurality of first insulating layers, and elements contained in a source gas and/or a by-product when forming the plurality of second insulating layers.

3. The forming method of the epitaxial layer of claim 1, wherein a gas atmosphere of the first annealing process is $N_2$, and a gas atmosphere of the second annealing process is $H_2$.

4. The forming method of the epitaxial layer of claim 1, wherein a material of the plurality of first insulating layers and a material of the plurality of second insulating layers are individually one of silicon oxide, silicon nitride, silicon oxynitride and silicon carbide nitride, and the material of the plurality of first insulating layers is different from the material of the plurality of second insulating layers.

5. The forming method of the epitaxial layer of claim 4, wherein in addition to comprising the silicon in the silicon-containing mixture, the silicon-containing mixture further comprises one or more of N, C, H, and O.

6. The forming method of the epitaxial layer of claim 1, wherein during the second annealing process, a temperature is 800-1200° C., a process time is 1-10 hours and a pressure of a chamber is less than 100 torr.

7. The forming method of the epitaxial layer of claim 1, wherein a gas utilized in the second annealing process is reacted with the silicon-containing mixture to form a gaseous reactant when performing the second annealing process.

8. The forming method of the epitaxial layer of claim 1, wherein Miller indices of the sidewall of the plurality of trenches are expressed as (111) after performing the second annealing process.

9. A forming method of a 3D NAND memory, comprising:

providing a substrate, wherein a stacked structure having a plurality of first insulating layers and a plurality of second insulating layers stacked alternately is formed on the substrate;

etching the stacked structure to form a plurality of channel holes passing through the stacked structure;

etching the substrate situated at bottoms of the plurality of channel holes along the plurality of channel holes to form a plurality of trenches in the substrate;

performing a first annealing process after forming the plurality of trenches, wherein a silicon-containing mixture is formed on sidewalls and bottom surfaces of the plurality of trenches when performing the first annealing process;

performing a second annealing process after performing the first annealing process, so as to remove the silicon-containing mixture;

utilizing a selective epitaxial growth process to form an epitaxial layer in the plurality of trenches after performing the second annealing process, wherein the plurality of trenches are fully filled with the epitaxial layer;

forming a storage structure in the plurality of channel holes above the epitaxial layer; and removing the plurality of first insulating layers, and forming a plurality of metal gates at positions corresponding to the removed plurality of first insulating layers.

10. The forming method of the 3D NAND memory of claim 9, wherein in addition to comprising the silicon in the silicon-containing mixture, the silicon-containing mixture further comprises one or more of elements contained in a gas used for the first annealing process, elements contained in a source gas and/or a by-product when forming the plurality of first insulating layers, and elements contained in a source gas and/or a by-product when forming the plurality of second insulating layers.

11. The forming method of the 3D NAND memory of claim 9, wherein a gas atmosphere of the first annealing process is $N_2$, a gas atmosphere of the second annealing process is $H_2$.

12. The forming method of the 3D NAND memory of claim 9, wherein a material of the plurality of first insulating layers and a material of the plurality of second insulating layers are individually one of silicon oxide, silicon nitride, silicon oxynitride and silicon carbide nitride, and the material of the plurality of first insulating layers is different from the material of the plurality of second insulating layers.

13. The forming method of the epitaxial layer of claim 12, wherein in addition to comprising the silicon in the silicon-containing mixture, the silicon-containing mixture further comprises one or more of N, C and H.

14. The forming method of the 3D NAND memory of claim 9, wherein during the second annealing process, a temperature is 800-1200° C., a process time is 1-10 hours and a pressure of a chamber is less than 100 torr.

15. The forming method of the 3D NAND memory of claim 9, wherein a gas utilized in the second annealing process is reacted with the silicon-containing mixture to form a gaseous reactant when performing the second annealing process.

16. The forming method of the 3D NAND memory of claim 9, wherein Miller indices of the sidewall of the plurality of trenches are expressed as (111) after performing the second annealing process.

* * * * *

UNITED STATES PATENT AND TRADEMARK OFFICE
CERTIFICATE OF CORRECTION

PATENT NO. : 10,741,390 B2  
APPLICATION NO. : 16/351532  
DATED : August 11, 2020  
INVENTOR(S) : Haifeng Guo et al.

Page 1 of 1

It is certified that error appears in the above-identified patent and that said Letters Patent is hereby corrected as shown below:

On the Title Page

Item (73), correct the name of the assignee from "Yangtz Memory Technologies Co., Ltd." to --Yangtze Memory Technologies Co., Ltd.--.

Signed and Sealed this  
Twenty-second Day of September, 2020

Andrei Iancu  
*Director of the United States Patent and Trademark Office*